United States Patent
Siegert et al.

(10) Patent No.: US 9,194,929 B2
(45) Date of Patent: Nov. 24, 2015

(54) CAMERA-SUPPORTED MOVEMENT DETECTION FOR MOVEMENT COMPENSATION IN REAL TIME IN MAGNETIC RESONANCE IMAGING

(75) Inventors: Thomas Siegert, Leipzig (DE); Jessica Schulz, Leipzig (DE); Robert Turner, Leipzig (DE); Enrico Reimer, Leipzig (DE)

(73) Assignee: MAX-PLANCK-GESELLSCHAFT ZUR FOERDERUNG DER WISSENSCHAFTEN E.V., Munich (DE)

( * ) Notice: Subject to any disclaimer, the term of this patent is extended or adjusted under 35 U.S.C. 154(b) by 452 days.

(21) Appl. No.: 13/519,883

(22) PCT Filed: Dec. 16, 2010

(86) PCT No.: PCT/EP2010/069887
§ 371 (c)(1),
(2), (4) Date: Aug. 15, 2012

(87) PCT Pub. No.: WO2011/080091
PCT Pub. Date: Jul. 7, 2011

(65) Prior Publication Data
US 2012/0320178 A1  Dec. 20, 2012

(30) Foreign Application Priority Data

Jan. 4, 2010 (DE) .......... 10 2010 004 023
Apr. 30, 2010 (DE) .......... 10 2010 018 899

(51) Int. Cl.
H04N 9/47 (2006.01)
G01R 33/565 (2006.01)
G01R 33/567 (2006.01)

(52) U.S. Cl.
CPC ...... *G01R 33/56509* (2013.01); *G01R 33/5673* (2013.01)

(58) Field of Classification Search
USPC .......................................... 348/77
See application file for complete search history.

(56) References Cited

U.S. PATENT DOCUMENTS 4,894,129 A * 1/1990 Leiponen et al. ............ 204/198
6,031,888 A * 2/2000 Ivan et al. ..................... 378/20
(Continued)

FOREIGN PATENT DOCUMENTS

| DE | 198 38 590 A1 | 3/2000 |
| DE | 100 51 415 A1 | 4/2002 |

OTHER PUBLICATIONS

International Preliminary Report on Patentability for PCT/EP2010/069887, mailed Jul. 19, 2012.
(Continued)

*Primary Examiner* — Tracy Li
(74) *Attorney, Agent, or Firm* — Lathrop & Gage LLP

(57) ABSTRACT

The invention relates to a method for compensating patient movements in MRI scans in real time and to a device suitable for carrying out said method. The method involves the following steps: optically sensing a marking element (5) connected to a patient (3) by means of an image sensor module (7) of an MRI-compatible camera (2) which is positioned inside an MRI device; transferring the image data detected by the image sensor module (7) to a micro-controller module (11) which is integrated in the MRI-compatible camera (2); calculating position data of the marking element (5) in the micro-controller module (11); and transmitting the position data to an external analyzing unit or to the MRI device in real time.

17 Claims, 3 Drawing Sheets

(56) References Cited

U.S. PATENT DOCUMENTS

| | | | |
|---|---|---|---|
| 6,421,551 B1 | 7/2002 | Kuth et al. | |
| 7,602,301 B1* | 10/2009 | Stirling et al. | 340/573.1 |
| 2002/0044204 A1 | 4/2002 | Zurl et al. | |
| 2005/0283068 A1 | 12/2005 | Zuccolotto et al. | |
| 2008/0129290 A1 | 6/2008 | Yao | |
| 2009/0052760 A1* | 2/2009 | Smith et al. | 382/132 |
| 2009/0209846 A1 | 8/2009 | Bammer | |
| 2009/0304297 A1* | 12/2009 | Adabala et al. | 382/248 |
| 2010/0091089 A1* | 4/2010 | Cromwell et al. | 348/33 |
| 2011/0201916 A1* | 8/2011 | Duyn et al. | 600/410 |

OTHER PUBLICATIONS

Anonymous (2008): "The Polaris Family of Products" [Online] retrieved from the Internet: URL:http://www.ndigital.com/medical/documents/polaris/polarisspectra/Comparison_Polaris_and_Polaris_Spectra.pdf> [retrieved on Jan. 31, 2011].

Anonymous (2008): "Tracking made in Germany: Optical tracking: A.R.T. Setup and System overview", "advanced realtime tracking GmbH", [Online] retrieved from the Internet: URL:http://web.archive.org/web/20080724005149/http://ar-tracking.de/> [retrieved on Jan. 31, 2011].

Tremblay et al. (2005), "Retrospective Coregistration of Functional Magnetic Resonance Imaging Data Using External Monitoring," Magnetic Resonance in Medicine, vol. 53, pp. 141-149.

Qin et al. (2007), "Prospective head movement correction for high resolution MRI using an in-bore optical tracking system," Proc. Intl. Soc. Mag. Reson. Med. 15, p. 1828.

Zaitsev et al. (2006), "Magnetic resonance imaging of freely moving objects: prospective real-time motion correction using an external optical motion tracking system," NeuroImage, vol. 31, No. 3, pp. 1038-1050.

International Search Report for PCT/EP2010/069887, mailed Mar. 9, 2011.

* cited by examiner

CAMERA-SUPPORTED MOVEMENT DETECTION FOR MOVEMENT COMPENSATION IN REAL TIME IN MAGNETIC RESONANCE IMAGING

CROSS-REFERENCE TO RELATED APPLICATIONS

This application is a U.S. National Stage Application under 35 U.S.C. §371 of International Application No. PCT/EP2010/069887, filed Dec. 16, 2010, which claims the benefit of German Application No. 2010 004 023.1, filed Jan. 4, 2010, and German Application No. 10 2010 018 899.9, filed Apr. 30, 2010. All of these applications are hereby incorporated by reference in their entireties.

DESCRIPTION

The present invention relates to an apparatus for the compensation of movements of a patient during MRT measurements in real time, the apparatus comprising at least one MRT-compatible camera, at least one evaluation unit and at least one connection for data exchange with the MRT appliance. On the other hand, the invention relates to a method of compensating movements of a patient during MRT measurements in real time, which comprises at least the steps of optical detection of a marking element connected to a patient by an image sensor module of an MRT-compatible camera positioned in the interior of an MRT appliance, transmission of the image data determined by the image sensor module to a micro-controller integrated in the MRT-compatible camera, calculation of position data of the marking element by the micro-controller and forwarding the position data to an external evaluation unit or the MRT appliance in real time.

The problem of the formation of artifacts by the movement of the patient during MRT measurements has long been known. Some attempts have also already been made, therefore, to minimize these movement artifacts or to correct the ascertained data by the simultaneous recording of the movement of the patients and corresponding correction of the MRT data or adaptation of the measurement parameters. A particular problem with respect to the movement artifacts is posed by MRT of the head, since it has a large number of degrees of freedom of movement and so corrections of the movement which are based on software are difficult. To this end an extremely precise detection of the movements is necessary. Already in the past, therefore, attempts were made to prevent or correct artifacts which are formed by the movement of the patient during MRT measurements.

In this way, a system which makes it possible on the one hand to communicate with the patient is disclosed for example in US 2005/0283068. By means of this it should be possible for the patient to be calmed down during the recording in the constricted and unfamiliar situation and to be informed of the progress of the measurement, in order to minimize his or her movements as a result. In addition, the movement of the head is recorded by an external camera and an apparatus situated on the patient's head and the MR tomogram obtained is corrected in accordance with these movements. In this way, an increase in the recordings which can be utilized from approximately 20% to over 90% are to be obtained, in particular in the case of children.

In 2006 a method was presented by Zaitsev et al. (Zaitsev, M et al., "Magnetic resonance imaging of freely moving objects: Prospective real-time motion correction using an external optical motion tracking system", NeuroImage 31 (2006) 1038 to 1050) which is intended to make possible a correction of movements of a body during an MRT measurement by the recording of the movement and adaptation to the measurement parameters. To obtain this, a framework on which four reflecting markers are arranged is fixed to the patient's teeth. The movement of these markers is detected by two IR cameras situated outside the MR tomograph (MRT). In combination with a novel calibration technique it is possible for movement artifacts to be substantially prevented.

In order to increase the resolution of the movement recording, the distance of the cameras which record the patient's movement was reduced. US 2009/0209846 discloses a system for the recording and correction of the patient's movements in which one or two IR cameras is or are situated closer to the patient, namely on the MRT coil. To this end the cameras have to be MR compatible. This means that they should not influence the alternating magnetic field and also not be influenced themselves by the magnetic field. In this case the cameras are arranged between the individual segments of the MRT coil and send video signals to a computer system which is situated outside the tomograph and which can detect movements of the patient directly or by way of the movement of markers fastened to the patient.

With a similar system (L. Qin et al. MRM 2009; 62(4):924 to 934) in which the cameras are positioned in the bore but the video signals are likewise processed outside the bore, it was possible for a tracking speed of only 10 Hz to be achieved, so that it is suitable exclusively for the correction of very slow movements.

The use of higher resolution MR tomographs (MR appliances) with currently used field strengths of 7 tesla and even higher sets new demands upon the detection of the patient's movements and the adaptation of the measurement to them. Movements of the patient must not only be identified and recorded more precisely and rapidly than hitherto, but they must also be transmitted rapidly and efficiently to suitable computers which carry out the correction of the MR tomogram or the adaptation of the measurement conditions on the basis of the movement data detected.

The object of the present invention is therefore to make available a system and a method which will identify and record movements of the patient more precisely and rapidly.

The subject matter of the present invention provides an apparatus and a method for the compensation of movements of a patient or any other moving item to be investigated during MRT measurements in real time, which will achieve this object according to the invention in accordance with the features of the independent claims 1 and 11.

The apparatus according to the invention for the compensation of movements of a patient during MRT measurements in real time, the apparatus comprising at least one MRT-compatible camera, at least one evaluation unit and at least one connection for data exchange with an MRT appliance, is characterized in that the MRT-compatible camera comprises at least one image sensor module for recording image data from which the patient's movement can be calculated, at least one interface module for the transmission of the image data and/or position data calculated from the image data and at least one micro-controller module for calculating the position data from the image data. By designing the cameras with integrated image processing it is possible for at least part of the image processing to be carried out already in the camera. What should be noted in particular is the micro-controller which is integrated in the MRT-compatible camera and which evaluates the obtained image data directly in the camera and determines the new position of the marking elements or the change of their position. In this way, it is made possible that the entire image does not have to be transmitted from the camera to an external evaluation unit, as in the prior art, but that the quantity of data can be reduced to the position data or the data of the change in position. In this way, significantly smaller amounts of data are necessary, and this in turn makes it possible for the speed of transmission and thus also the image repetition frequency to be significantly increased. The design of the image sensor module, the interface module and the micro-controller module in the form of separate structural elements has been found to be advantageous in order to replace individual modules rapidly and thus in order to be able to adapt to changed requirements. It is likewise possible, however, for a plurality of modules to be arranged jointly on a card, and this permits a more compact structural shape.

The MRT-compatible cameras (tracking cameras) may be cameras which are operated at different radiation frequencies. For example, cameras which operate in the infrared (IR) range have been found to be suitable. They emit IR radiation which is reflected by the marking elements (markers) and then detected by the camera. In addition, it is preferable for each of the cameras to be additionally capable of supplying a video signal. This can likewise be in the IR spectrum or even in the visible range.

In a particularly preferred embodiment the apparatus is characterized in that a plurality of MRT-compatible cameras are arranged in the interior of an MRT, preferably directly on a head coil of the MRT appliance. On account of this arrangement it is possible for the distance between the patient and the cameras to be reduced, which leads to a significant increase in accuracy in the determination of position data. The distances between the camera and the respective item to be detected are usually less than 50 cm. The accuracy of the determination of the position can be further improved by a further reduction in the distance between the item and the camera. Distances of less than 30 cm, less than cm or even less than 7 cm have been found to be particularly advantageous. Depending upon the camera lens used and the focal length thereof, a sufficiently large movement space is detected and at the same time a high degree of accuracy of the determination of the position is possible.

In order to reduce further the distance between the MRT-compatible camera and the item to be detected, in a further preferred embodiment of the apparatus it is provided that at least one marking element is connected directly to the patient or is connected to the patient by way of a framework at a distance from him or her and that at least one of the marking elements is at a distance of less than 30 cm from one of the MRT-compatible cameras. This embodiment with the use of marking elements is used on the one hand to simplify the detection of the movement. In this way, for example, markings can be used which are particularly simple to detect by the MRT-compatible cameras used in each case. For example the markings can have specified colours which differ significantly from all the other colours in the observation space. Other combinations of marker properties and MRT-compatible cameras compatible with them, which permit a very precise determination of the location of the marking element, are also possible. In addition, systems which do not operate in an optical manner are possible in this respect. Combinations which operate in the infrared (IR) range have been found to be particularly suitable. The marking elements suitable therefor are of non-magnetic materials which do not have a negative effect or do not have a significantly negative effect upon the measurement of the MR tomogram. Accordingly, cameras are used which likewise operate in the IR range.

The described use of marking elements which are compatible with one another and MRT-compatible cameras ensures in a particular embodiment that the at least one marking element is capable of being detected by the image sensor module of the at least one MRT-compatible camera and the position of the marking element is capable of being calculated by the micro-controller module of the at least one MRT-compatible camera from the image data obtained. In the ideal case it is possible, by the choice of an advantageous combination of the marking element and the MRT-compatible camera and the observation of a precisely defined radiation spectrum, to obtain a high-contrast image. In order to improve the contrast, it is also optionally possible for filters to be used which filter out interfering frequencies outside the radiation spectrum selected. The micro-controller incorporated in the camera can evaluate the image obtained and can determine the position of the marking element relative to the camera.

In order to facilitate the evaluation by the cameras and, at the same time, also to increase the accuracy of the determination of the position, in a particularly preferred embodiment of the apparatus it is provided that the apparatus has the same number of marking elements as MRT-compatible cameras, and that each of the MRT-compatible cameras has assigned to it precisely one marking element which is situated in an optical detection region of the image sensor module of the MRT-compatible camera. As a result, it is made possible on the one hand for each camera to be occupied only with the calculation of the position data of a marking element and thus for this to be capable of being carried out as quickly as possible. On the other hand, on account of the fact that only precisely one marking element is positioned in each case in the optical detection range of the respective MRT-compatible camera, it is possible to prevent breakdowns and erroneous calculations by confusion of the marking elements which are not distinguishable from one another.

In a particularly preferred embodiment of the apparatus the position data calculated by the micro-controller module comprise fewer than 100 bytes per image. In this way, despite a high resolution of the image detected by the image sensor unit, a very small quantity of data is implemented which allows a rapid transmission of data to the external evaluation unit or the MRT appliance. In principle, even significantly lower quantities of data are also possible. In this way, the position data can even be reduced to 5 bytes per image or less, if the minimum and maximum values of the extension of the marking element are merely determined in two dimensions in the image ascertained by the image sensor module. Further data can optionally be added to the set of position data, for example for the clear identification of the emitting camera.

In a further particularly preferred embodiment of the apparatus the accuracy of the position data calculated by the micro-controller module is in the sub-pixel range. One possibility of achieving this is not only to determine the points of the image of the marking element recorded by the image sensor module, which represent the maximum extension of the marking element, but to include in the calculation of the position a large portion of the edge region bounding the marking element on the respective sides. As a result of observing a larger edge region, the dimensions of the marking element can be determined significantly more accurately and the position data for the points which represent the maximum extension in the respective direction can be calculated, which are in the sub-pixel range.

In addition, in a preferred embodiment the apparatus is characterized in that the transmission rate of the position data calculated by the micro-controller module is greater than 30 Hz, and in a particularly preferred manner at least 60 Hz (without taking into consideration the trigger signal (see below)). A correspondingly high transmission rate of the marker position values is not possible in the desired image quality according to the prior art with apparatus positioned inside the bore for detecting movement of the patient during MRT measurements. In the apparatus according to the invention the transmission rate of over 30 Hz, and in a particularly preferred manner of at least 60 Hz (without taking into consideration the trigger signal), is made possible by the calculation of the position from the image data directly in the camera and the enormous reduction of the quantity of data to be transmitted as a result. This reduction in data additionally allows the use of relatively simple and thin cables. Depending upon the scope of the reduction in data, far higher data rates are likewise possible. Data rates of 60 Hz or more are usually used. The resolution of the image sensor module does not adversely affect the transmission rate or adversely affects it only marginally in this case, since no high-resolution image data but position data calculated by the micro-controller are transmitted. Although a higher resolution allows a more accurate calculation of the position, however, it does not significantly reduce the transmission rate from the micro-controller module to the MRT appliance or an external evaluation unit.

Since simpler data connections and plugs also allow a rapid transmission of data reduced to position data, a preferred embodiment of the apparatus is characterized in that each of the MRT-compatible cameras has a serial interface attachment for attaching an attachment line for the transmission of the position data calculated by the micro-controller module to an external evaluation unit or an MRT appliance. The serial interface attachment used can be for example an EIA-RS-232 interface or even any other modern serial interface such as Ethernet, Firewire, USB, RS-485, CAN-Bus or others. In principle, cable-free data transmissions such as WLAN and Bluetooth are also possible. These, however, are not preferred on account of the influencing of the magnetic field and thus the disturbance of the MRT measurement. In order to prevent a negative influencing of the MRT measurement, the transmission cables used are screened cables.

In a further particularly preferred embodiment of the apparatus each of the MRT-compatible cameras has a trigger input/output for synchronization with the MRT appliance. In order to optimize the real-time behaviour of the tracking system it is necessary to reduce the delay times between the recognition of a movement and the adjustment of the gradients. This makes an optimum timing and a synchronization of the systems between one another necessary.

A trigger signal in a sequence of the MRT is produced for the synchronization of the tracking system with the MRT. This trigger signal is detected and evaluated by the tracking system in order for example to adapt the image repetition rate of the image sensor to the repetition time of the MRT. In addition, image details (ROI) to be detected can be defined by using a CMOS image sensor, and in combination with the trigger signal this contributes to reductions in the delay times and thus substantially improves the real-time behaviour. On account of the synchronization the position data are made available with the repetition rate of the MRT which can be below 60 Hz.

A further essential aspect of the invention is a method of compensating the movements of a patient during MRT measurements in real time, which comprises at least the steps of optical detection of a marking element connected to a patient by an image sensor module of an MRT-compatible camera positioned in the interior of an MRT appliance, transmission of the image data determined by the image sensor module to a micro-controller module integrated in the MRT-compatible camera, calculation of position data of the marking element by the micro-controller module and forwarding of the position data to an external evaluation unit or the MRT appliance in real time.

By means of this method it is possible to produce an image of a marking element connected to a patient through the optical detection by an image sensor module first. The obtained image data of the MRT-compatible camera positioned in the interior of an MRT appliance are forwarded internally to a micro-controller module which is integrated in the MRT-compatible camera and which calculates the position data of the marking element from these data in real time. After that, the forwarding of the position data to an external evaluation unit or the MRT appliance likewise takes place in real time. In this way, it is possible to react to the patient's movements immediately in the MRT appliance and for the measurement to be adapted in a manner corresponding to the patient's movement. In the same way, the position data determined could also be used when putting together the individual layer images determined in the MRT appliance.

In a particularly preferred embodiment of the method, the image data detected by the image sensor are saved directly in a memory, for example SDRAM, in a parallel process. This method has been found to be particularly advantageous since, as a result of the transmission of the image data in a parallel process directly into the memory, a particularly high speed can be achieved. Rapid SDRAMs are advantageous in this case. Other memories, however, are also possible.

In a further special embodiment the method is characterized in that the position data calculated by the micro-controller module are transmitted to the interface module and are forwarded from there to an external evaluation unit or an MRT appliance. In this case the interface module comprises the connection to the external evaluation unit or an MRT appliance. The position data calculated by the micro-controller module are transmitted to the interface module and they are optionally prepared there for transmission and/or for passing on to external appliances. The transmission is then carried out from the interface module.

In a further particularly preferred embodiment of the method the forwarding of the position data from the MRT-compatible camera to an external evaluation unit or an MRT appliance is carried out at a transmission speed of at least 30 Hz. In this case significantly higher transmission rates such as for example 60 Hz or more are also possible. As a result of the reduction of the image data to the position data which has been carried out, however, the data transmission to the external evaluation unit or the MRT appliance is not the step which determines the speed. In the case of the amounts of data of less than 10 bytes per image which are generally used, the performance of the micro-controller and the calculation of the position data carried out by the latter from the image data represent the step which determines the speed. A micro-controller module of the type Module TNY-A9G20-XXX used for example with a micro-controller ATMEL AT91SAM9G20 makes available, however, a calculation capacity which is already sufficient in order also to be able to calculate the position data from image data with a higher resolution than 640×480 image dots so rapidly that transmission rates of for example 60 Hz or even more are possible.

Before, and where appropriate also during, the MRT measurements it is important to be able to observe the patient in order to monitor his or her condition and to check whether he or she is in a position suitable for the measurement. A preferred method is therefore characterized in that before the MRT measurement, and if necessary also during the measurement, a transmission of an additional video signal based upon the image data from the MRT-compatible camera to a monitoring unit is carried out for a time. In this case the image recorded by the image sensor module is not forwarded exclusively to the micro-controller module for determining the position data, but is also or even exclusively passed on to external appliances by way of the interface module. The image data obtained can be represented and evaluated on these appliances. In this way, it is possible to assess for example whether the patient is in a proper position with respect to the tracking system. In addition, it is possible to track his or her movements and reactions to for example instructions. In this way, it is possible to a certain extent to react to the state of the patient and for example to his or her anxieties in the narrow tube of the MRT appliance. In addition, the video signal can be used for adjusting the optical appliances and for example for correcting the lens distortion.

Further advantages, aims and properties of the present invention are explained with reference to the following description of accompanying drawings, in which apparatus according to the invention for the compensation of movements of a patient during MRT measurements in real time are illustrated by way of example. Components of the apparatus for the compensation of movements of a patient during MRT measurements in real time, which correspond at least substantially with respect to their function in the figures, can be designated with the same references in this case, it being unnecessary for these components to be numbered and explained in all the figures. In the figures FIG. 1 is an illustration of a head coil with MRT-compatible cameras arranged on it;

Figure 1:
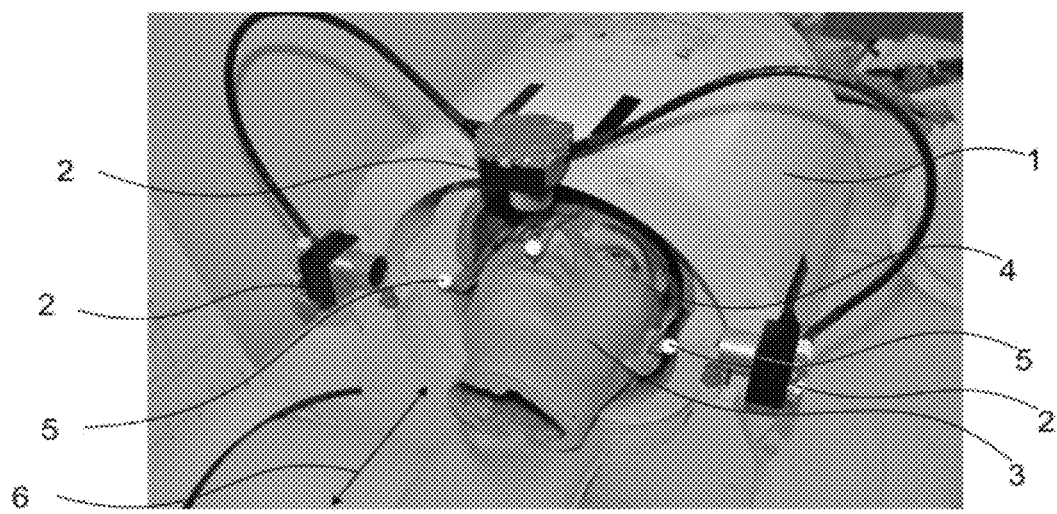

FIG. 1 is an illustration of a head coil 1 with MRT-compatible cameras 2 arranged on it. A model of a human head 3 is situated in the interior of the head coil 1. Marking elements 5, the movement of which is recorded by one of the MRT-compatible cameras 2 in each case, are fastened to this model 3 by way of a framework 4. The MRT-compatible cameras 2 are preferably fastened directly to the head coil 1 of the MRT. On account of the short distance between the marking elements 5 and the MRT-compatible cameras 2 of less than 10 cm in this case, a very precise determination of the position and size of the individual marking elements 5 is possible. On account of the arrangement of the marking elements 5 at a distance from the patient 3 by means of a framework 4 the distance between the marking elements 5 and the MRT-compatible cameras 2 can be further reduced. In order to achieve, in addition, as high a resolution as possible with respect to the longitudinal axis 6 of the MRT tube, the angles at which the MRT-compatible cameras 2 are arranged relative to one another with respect to the longitudinal axis 6 of the MRT tube are selected to be large. It is preferable for them to amount to between 40° and 190°, and in a particularly preferred manner to approximately 90°.

Each of these MRT-compatible cameras 2 is capable of tracking very precisely the movement of the marking element 5 connected to the patient 3. In a preferred embodiment each of the cameras records the movement of precisely one marker. As a result, each of the micro-controllers integrated in the MRT-compatible cameras 2 has to calculate only the position of precisely one marking element 5, as a result of which it is possible to determine the positions of the individual markers with a very high degree of precision and, in addition, with very high image repetition rates. In this way, with image repetition rates of 60 Hz or even more the calculation of the position of the marking element 5 assigned in each case to the camera 2 up to 10 µm is possible. It is also possible, however, for one camera to detect the movements of a plurality of markers (multi-tracking).

Figure 2:
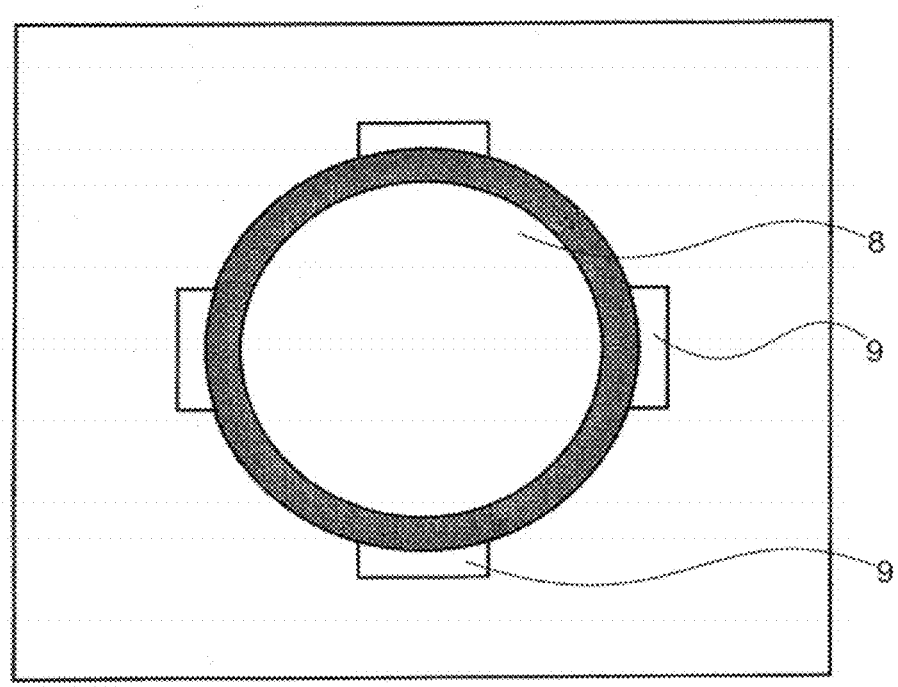
FIG. 2 is a diagrammatic illustration of an image of a marking element recorded by an image sensor module with designation of the edge region relevant for determining the position data.

FIG. 2 is a diagrammatic illustration of an image 8 of a marking element 5 recorded by an image sensor module 7 with the designation of the edge region 9 relevant for determining the position data. It is usual for the image 8 of a marking element 5 recorded by an image sensor module to be used only inside the camera for calculating the position and not to be forwarded to external appliances. The illustration shown of a marking element 5 with the designation of the edge region 9 relevant for determining the position data can also be displayed, however, on external monitors in order to check the camera operations. The edge region 9 of an image 8 of a marking element 5 is to be understood as being the edge regions of the marking element imaging which are situated within a pre-determined distance, starting from the respective minimum and maximum values of the image of the marker in the direction of the axes of a co-ordinate system, at a right angle to these axes. The edge regions 9 shown extend in each case substantially over a length which corresponds to from 20% to 50% of the maximum extension of the image 8 of a marking element 5. Which region is selected for the calculation depends inter alia upon the calculation capacity available, the image resolution and the desired accuracy of the calculation. By taking into consideration a larger range the maximum value of the extension of the image 8 of a marking element 5 can be calculated from the pattern of the curve—following the image—of the edge region 9 relevant for determining the position data. This calculated value is, as it was calculated from a multiplicity of values, far less susceptible to errors than the consideration of an individual image point. In addition, the result of this calculation can also assume values which represent intermediate values of the image 8 of a marking element 5 limited by the image dot pattern in the resolution. In this way, in the calculation of the positions of the minimum and maximum values of the marking element imaging 8 accuracies can be achieved which are in the sub-pixel range. In this way, with a distance of approximately 10 cm between the marking elements 5 and the MRT-compatible cameras 2 resolutions of up to 10 µm can be achieved using a 640×480 pixel image sensor module 7.

The position and size of each individual marking element 5 is described in this case by four sub-pixel values. In order to calculate the patient's movement, therefore, only the four sub-pixel values, which represent the minimum and maximum values of the extension of the marking element 5, and an additional identification signal of the respective camera 2 are required and are transmitted from the camera 2 to an external appliance. Deviating from this method, other clear descriptions of the position and size of the respective marking element 5 are also possible. For example, it would be possible for example for the mid-point and the extension to be calculated and transmitted in one or two directions. In this way, including information to identify the camera 2 transmitting in each case, an enormous reduction in the data transfer to a few bytes is possible. Less than 10 bytes are thus transmitted per piece of image information. When the data are reduced to the minimum and maximum values of the extension of the marking element 5, only 5 bytes including the identification signal of the respective camera (2) are transmitted.

Figure 3:
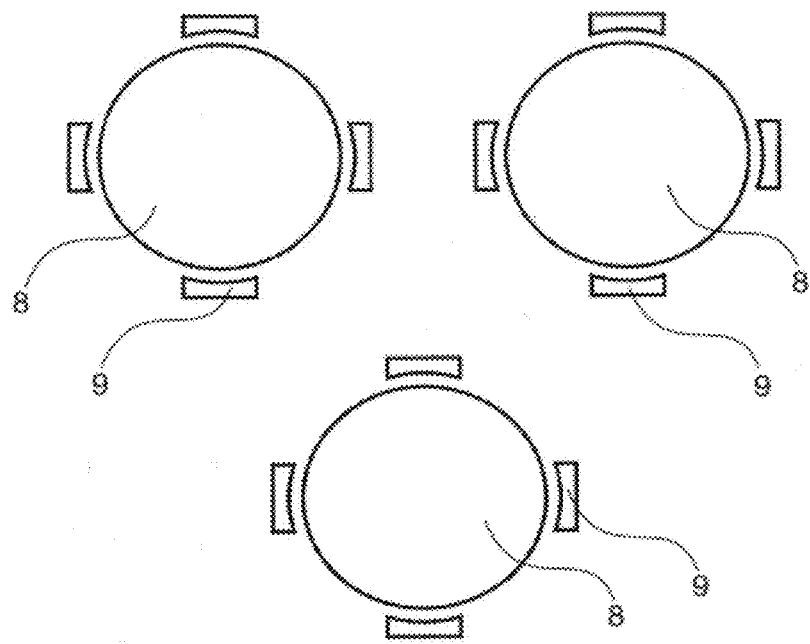
FIG. 3 is a diagrammatic illustration of the recording of an MRT-compatible camera of three marking elements whilst emphasizing the edge regions relevant in each case.

FIG. 3 is a diagrammatic illustration of the images 8—recorded by the image sensor of an MRT-compatible camera—of marking elements 5 whilst emphasizing the edge regions 9 relevant in each case. As in the illustration of FIG. 2 as well, the illustration of FIG. 3 is not normally displayed on external appliances. It serves only to monitor the edge regions 9 used for calculating the position. When a plurality of marking elements 5 are used it is possible for a multiplicity of marking elements 5 to be displayed at the same time on a monitor whilst emphasizing the edge regions 9 relevant in each case.

Figure 4:
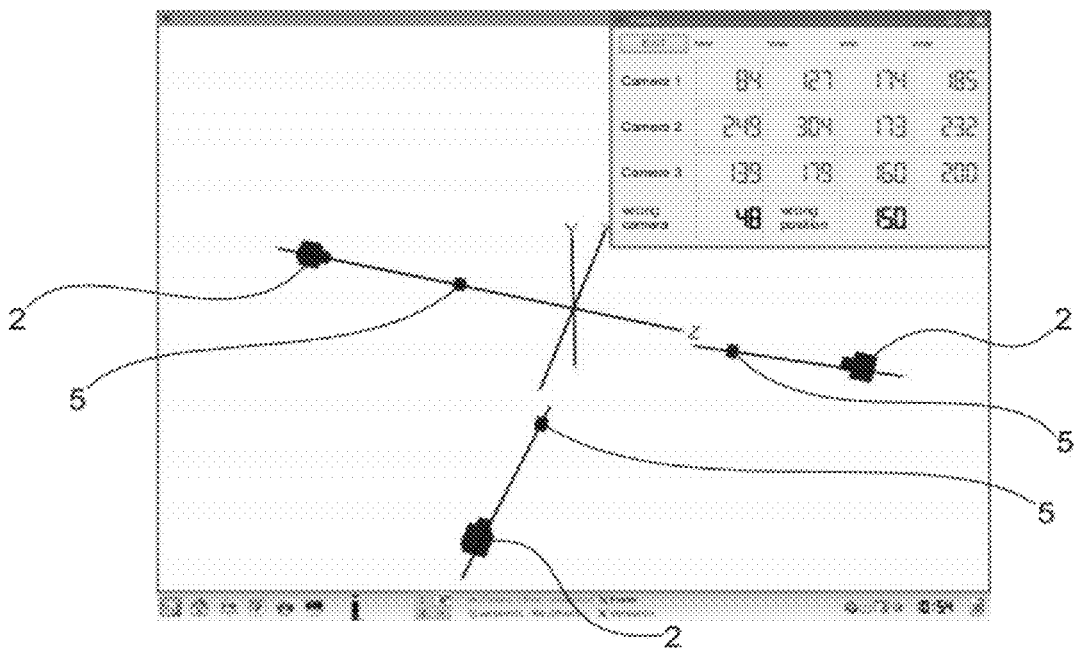
FIG. 4 is an illustration of a possible evaluation—represented graphically—of the position data determined and transmitted.

FIG. 4 is an illustration of a possible evaluation—represented graphically—of the position data determined and transmitted. A computer graphic is shown, which displays both the transmitted position data of the respective marking elements 5 as co-ordinates in an upper right-hand area and the spatial arrangement of the in this case three marking elements 5 in the three-dimensional space spanned by the X, Y and Z axes in the central area. In addition, the MRT-compatible cameras 2 are illustrated diagrammatically as fixed reference points. Translational and rotational parameters of the patient's movement can be indicated by this illustration. An illustration of this sort is not absolutely necessary for adapting the parameters of the MRT measurement or the processing of the MRT data determined. It is used only to be able to track the patient's movement in a considerably simplified manner in the form of a graph.

Figure 5:
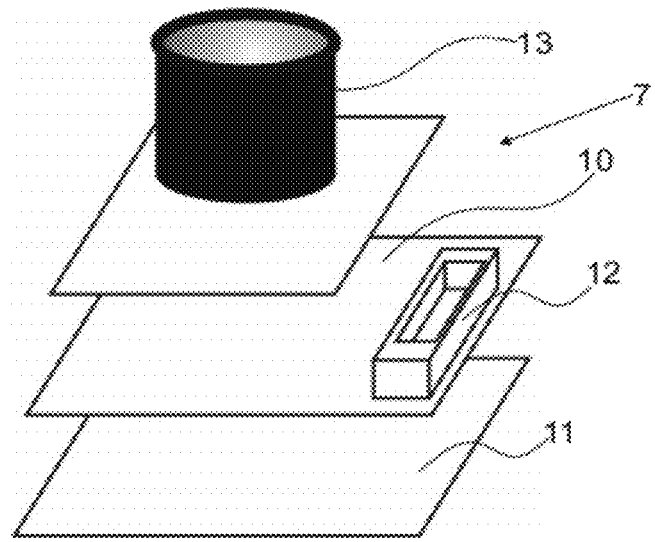
FIG. 5 is a diagrammatic illustration of an MRT-compatible camera.

FIG. 5 is a diagrammatic illustration of an MRT-compatible camera 2. As is clearly evident, an MRT-compatible camera 2 is built up in a modular manner. It comprises an image sensor module 7, an interface module 10 and a micro-controller module 11. The image sensor module 7 has a lens 13 and electrical components for the digitalization of the image data. As a result, the image sensor module 7 is able to generate an image 8 of a marking element 5. This image is forwarded to a micro-controller module 11 by way of the interface module 10 in a parallel process and it is saved in the memory there. This memory can be an SDRAM or any other suitable memory variant. The calculation of the position of the marking element 5 is carried out in the micro-controller module 11 from the data saved in the memory. It is preferable for the micro-controller module 11 to comprise a micro-controller with a high calculation capacity which allows the position to be calculated in real time. For example, a Module TNY-A9G20-XXX with a micro-controller ATMEL AT91SAM9G20 can be used. This micro-controller also allows the position to be calculated even from images of higher resolution with a clock time of 400 MHz. The calculation capacity of the micro-controller can thus also be selected to be higher or lower in a manner dependent upon the resolution and depending upon the desired image or transmission frequency. When high-capacity micro-controllers such as the ATMEL AT91SAM9G20 mentioned are used, sufficient calculation capacity is available in order to be able to carry out further tasks such as for example the correction of distortion, the calculation of translational and rotational parameters and others directly in the camera. The data calculated by the micro-controller module 11 are forwarded to the interface module 10 and are forwarded from there to external appliances by way of a data connection (not shown). The data transmission can be carried out in a cable-free manner or by means of screened cables attached by way of a plug 12.

Figure 6:
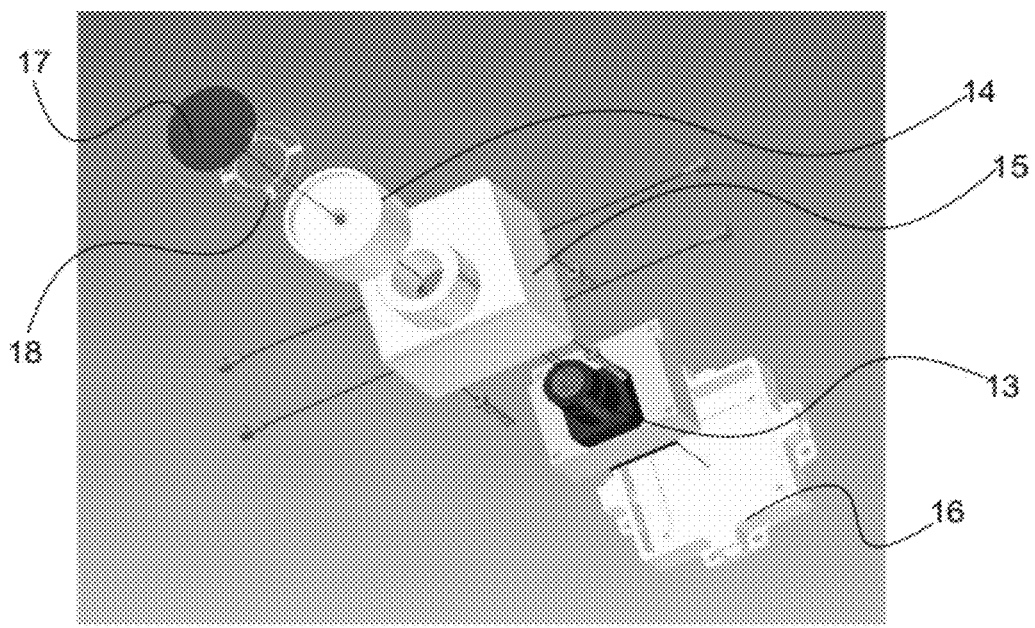
FIG. 6 is an exploded drawing of an MRT-compatible camera to explain the positioning thereof in an MRT-compatible housing.

A precondition for use in strong magnetic fields is a suitable screening of the cameras and the cabling. Each of the cameras is therefore screened off by a housing. FIG. 6 is an exploded drawing of an MRT-compatible camera 2 to explain the positioning thereof in an MRT-compatible housing for screening purposes. In order to prevent interaction of the camera electronics with the MRT appliance and the radiation thereof, each of the MRT-compatible cameras 2 is preferably situated in an MRT-compatible camera housing which has an adequate screening. A camera housing of this type comprises at least one lens housing 14, a front camera housing 15 and a rear camera housing 16. The front camera housing 15 and the rear camera housing 16 have the camera 2 situated between them, the lens 13 of which extends through a corresponding opening in the front camera housing 15 and enters the lens housing 14. Transmission devices 18, for example LEDs, which emit the radiation which is reflected by the marking elements 5 and which can be detected by the MRT-compatible camera 2, are arranged on the lens housing 14. In the case of the radiation range preferably used in the IR spectrum, IR LEDs are accordingly used. The current supply of the LEDs can take place through openings (not shown) in the lens housing 14 or by way of external attachments. The lens housing 14 shown in FIG. 6 and the LEDs 18 are covered by a filter 17 which filters out undesired radiation or frequencies. As a result, the detection of the marking elements 5 is simplified and the selectivity for the IR radiation is increased.

Double-screened data cables (not shown) are used for the data transmission. Tests have shown that when the double-screened data cables are used the positioning of the cameras provided with a housing in the MR tomograph does not lead to artifacts which have a negative influence upon the imaging. In order to prevent interaction of the frequencies of the cameras and the MRT, the frequency of the image sensor can be varied. In this way it is possible to select frequencies of which the harmonics do not interfere with the frequencies of the MRT. This can be determined by an RF-NOISE test.

Certain features disclosed in the application are understood to be novel, including for example, features either individually or in combination with other features as compared with the prior art.

LIST OF REFERENCE NUMERALS 1 head coil of the MRT
2 MRT-compatible camera
3 patient, test person, item to be tested
4 framework
5 marking element
6 longitudinal axis of the MRT tube
7 image sensor module
8 imaging of a marking element
9 designation of the edge region
10 interface module
11 micro-controller module
12 plug
13 lens
14 lens housing
15 front camera housing
16 rear camera housing
17 filter
18 LEDs

The invention claimed is:
1. An apparatus for the compensation of movements of a patient during MRT measurements in real time, the apparatus comprising at least one MRT-compatible camera, at least one evaluation unit and at least one connection for data exchange with an MRT appliance, wherein the MRT-compatible camera comprises at least one image sensor module for recording image data from which the patient's movement can be calculated, at least one interface module for the transmission of the image data and/or position data—calculated from the image data—of at least one marking element connected to the patient and at least one micro-controller module for calculating the position data from the image data, wherein the MRT-compatible camera is arranged in the interior of the MRT appliance inside a bore in the MRT appliance and the micro-controller module is integrated in a screened housing of the MRT-compatible camera to prevent interaction with the MRT appliance and the radiation thereof.

2. The apparatus according to claim 1, wherein a plurality of the MRT-compatible cameras is arranged directly on a head coil of the MRT appliance.

3. The apparatus according to claim 1, wherein the at least one marking element is connected directly to the patient or is connected to the patient by way of a framework at a distance from the patient and at least one of the marking elements is at a distance of less than 30 cm from one of the MRT-compatible cameras.

4. The apparatus according to claim 3, wherein the at least one marking element is capable of being detected by the image sensor module of the at least one MRT-compatible camera and the position of the marking element is capable of being calculated by the micro-controller module of the at least one MRT-compatible camera from the image data obtained.

5. The apparatus according to claim 3, wherein the apparatus has the same number of marking elements as MRT-compatible cameras, and each of the MRT-compatible cameras has assigned to it precisely one marking element which is in an optical detection region of the image sensor module of the MRT-compatible camera.

6. The apparatus according to claim 1, wherein the position data calculated by the micro-controller module comprise fewer than 100 bytes per image.

7. The apparatus according to claim 1, wherein the accuracy of the position data calculated by the micro-controller module is in the sub-pixel range.

8. The apparatus according to claim 1, wherein the transmission rate of the position data calculated by the micro-controller module is greater than 30 Hz.

9. The apparatus according to claim 1, wherein each of the MRT-compatible cameras has a serial interface attachment for attaching an attachment line for the transmission of the position data calculated by the micro-controller module to an external evaluation unit or the MRT appliance.

10. The apparatus according to claim 1, wherein each of the MRT-compatible cameras has a trigger input/output for synchronization with the MRT appliance.

11. The apparatus according to claim 1, wherein the transmission rate of the position data calculated by the micro-controller module is at least 60 Hz.

12. A method of compensating the movements of a patient during MRT measurements in real time, comprising at least the following steps:
    optically detecting a marking element connected to the patient using an image sensor module of an MRT-compatible camera positioned in the interior of an MRT appliance,
    transmitting image data of the image sensor module to a micro-controller module integrated in a screened housing of the MRT-compatible camera to prevent interaction with the MRT appliance and the radiation thereof,
    calculating position data of the marking element connected to the patient in the micro-controller module in the interior of the MRT appliance inside a bore in the MRT appliance, and
    forwarding the position data to an external evaluation unit or the MRT appliance in real time.

13. The method according to claim 12, wherein the image data detected by the image sensor module are saved directly in a memory of the micro-controller module in a parallel process.

14. The method according to claim 12, wherein the position data calculated by the micro-controller module are transmitted to an interface module and are forwarded from the interface module to the external evaluation unit or the MRT appliance.

15. The method according to claim 14, wherein the forwarding of the position data from the MRT-compatible camera to the external evaluation unit or the MRT appliance is carried out at a transmission speed of at least 30 Hz.

16. The method according to claim 14, wherein the forwarding of the position data from the MRT-compatible camera to the external evaluation unit or the MRT appliance is carried out at a transmission rate of at least 60 Hz.

17. The method according to claim 12, wherein before and/or during an MRT measurement a transmission of an additional video signal based upon the image data from the MRT-compatible camera to a monitoring unit is carried out for a time.

* * * * *